United States Patent

Russell

[15] 3,693,092

[45] Sept. 19, 1972

[54] AGC IMPEDANCE CONVERTER FOR VARACTOR DIODE TUNER

[72] Inventor: William G. Russell, Kitchener, Ontario, Canada

[73] Assignee: Electrohome Limited, Kitchener, Ontario, Canada

[22] Filed: Oct. 2, 1970

[21] Appl. No.: 77,525

[52] U.S. Cl. ..................325/319, 325/405, 325/422, 325/455, 325/457, 325/461, 325/465, 334/15, 178/5.8 F

[51] Int. Cl. ..............................................H04b 1/16

[58] Field of Search......325/318, 319, 399, 401, 404, 325/405, 408, 410, 415, 418, 422, 423, 454, 457, 458–463, 465, 455; 334/14–16, 42, 52; 178/5.8 AF, 5.5 AF, 7.3 R

[56] References Cited

UNITED STATES PATENTS

| | | | |
|---|---|---|---|
| 3,555,182 | 1/1971 | Griepentrog | 178/7.3 R |
| 3,435,359 | 3/1969 | Sennhenn | 325/405 |

*Primary Examiner*—Albert J. Mayer
*Attorney*—Sim & McBurney

[57] ABSTRACT

A signal receiver of a type including an AGC network providing an AGC signal and also a type employing a varactor tuner is provided with an AGC converter network to convert the AGC output signal to a level and source impedance suitable for use with the tuner.

8 Claims, 7 Drawing Figures

PATENTED SEP 19 1972

3,693,092

SHEET 1 OF 3

INVENTOR.
WILLIAM G. RUSSELL

BY

Agent

*INVENTOR.*
WILLIAM G. RUSSELL

*BY*

Agent

INVENTOR.
WILLIAM G. RUSSELL

BY

Agent

AGC IMPEDANCE CONVERTER FOR VARACTOR DIODE TUNER

This application is related to the following copending applications:

| Serial Number | Filing Date |
|---|---|
| 77,414 | October 2, 1970 |
| 77,656 | October 2, 1970 |
| 77,906 | October 5, 1970 |
| 78,027 | October 5, 1970. |

This invention relates to signal translating networks and to control circuits. More particularly, this invention relates to networks that are particularly useful in the controlling of varactor (voltage variable capacitance diode) tuners for television receivers, for example. It is to be understood, however, that while circuits and networks of this invention will be disclosed hereinafter as used in conjunction with a varactor tuner, this is by way of illustration only and is not intended to be limiting, since certain circuits and networks of this invention may have other applications as well, as will be readily apparent.

In accordance with a first aspect of this invention, new and useful channel selecting networks are provided.

In accordance with a second aspect of this invention, new and useful AGC converter networks are provided.

In accordance with a third aspect of this invention, new and useful band switching networks are provided.

In accordance with a fourth aspect of this invention, new and useful AFT conversion networks are provided.

In accordance with a fifth aspect of this invention, new and useful clamp circuits for AFT control are provided.

In accordance with a sixth aspect of this invention, new and useful tuning range control networks are provided.

In accordance with a seventh aspect of this invention, new and useful AGC switching circuits are provided.

Networks and circuits embodying this invention it its various aspects now will be disclosed in detail with reference to the appended drawings, in which.

Figure 1:
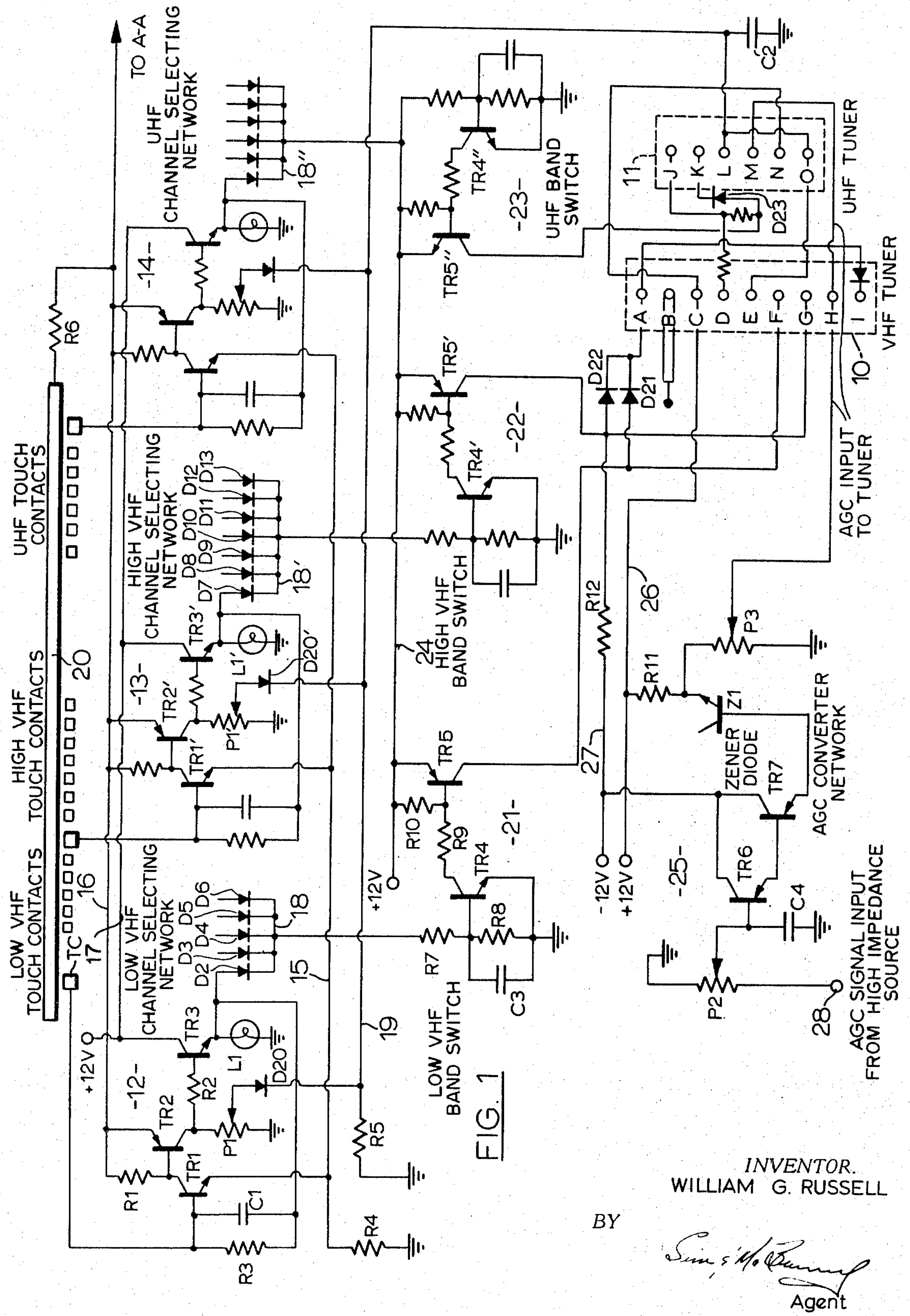
FIG. 1 is a circuit diagram showing a varactor tuner and the following aspects of this invention: a channel selecting network; a band switching network and an AGC converter network.

Referring to Fig. 1, the varactor tuner is of a conventional type and consists of a VHE tuner 10 and a UHF tuner 11. The VHF tuner has the following terminals:

A–$B^+$for oscillator, B–IF output, C–$B^+$for mixer, D–UHF IF input, E–tune voltage input, F-padding voltage input, G-band switching diode voltage input, H–AGC input and I–RF $B^+$. The UHF tuner has the following terminals: J–UHF IF output, K-oscillator-mixer $B^+$, L-tune voltage input, M–AGC input, N–RF $B^+$and O-tune voltage input.

The networks designated 12, 13 and 14 in Fig. 1 are channel selecting networks. Each network is the same, so a description of only one of the networks is required. Thus, network 12 includes three transistors TRl, TR2 and TR3. The base of transistor TR1 is connected to a touch contact TC, while its emitter is connected to a cancel bus 15 and its collector is connected via a resistor R1 to a power supply bus 16 maintained at a nominal voltage of, say, +30 volts. The base of transistor TR2 is connected directly to the collector of transistor TR1. The emitter of transistor TR2 is connected to bus 16, while the collector thereof is connected via a potentiometer P1 to ground. Connected between the collector of transistor TR2 and the base of transistor TR3 is a current limiting resistor R2. The collector of transistor TR3 is connected to another power supply bus 17 at a voltage of, say, +12 volts. A lamp L1 is connected between the emitter of transistor TR3 and ground. The voltage developed across lamp L1 is fed back to the base of transistor TR1 via a resister R3 that is shunted by an AC bypass capacitor C1. The emitter of transistor TR3 is connected via an isolating diode D2 to a bus 18. The slider of potentiometer P1 is connected via an isolating diode D20 to a tuning bus 19. Cancel bus 15 is connected via a resistor R4 to ground, while a resistor R5 is interposed between tuning bus 19 and ground, and a bypass capacitor C2 is connected between the tuning bus and ground.

It is to be understood that there is an identical network to network 12 for each low VHF channel, i.e., for each of channels, 2, 3, 4, 5, and 6, but that only the diodes D3 to D6 inclusive for the corresponding networks for channels 3 – 6 have been shown. Each network has its own touch contact, of course. Similarly, there is a network 13 corresponding to network 12 for each high VHF channel, i.e., for each of channels 7 to 13 inclusive and a network 14 corresponding to network 12 for each of, say, six UHF channels. More or less UHF channels could be provided as desired.

While the various networks 12–14 are the same, the sliders of the various potentiometers P1, P1', etc. are set at different positions, so that different tuning voltages will be picked off and delivered to tuning bus 19, these voltages having been predetermined to be at the levels required to cause tuning of the varactor tuner to the channels selected.

In order to describe the operation of the channel selecting networks, it will be assumed that the receiver is tuned to channel 7. This means that transistors TR1', TR2' and TR3' will be conducting, lamp L1' will be on indicating which network is operating, and a voltage corresponding to the voltage required for tuning to channel 7 will be supplied to tuning bus 19 via diode D20' and thence to the variable capacitance tuning diodes of the varactor tuner. In addition there will be a voltage developed across resistor R4 of, say, +8 volts due to conduction of transistor TR1'. If it now is desired to tune the receiver to channel 2, for example, this is achieved by placing one's finger between touch contact TC and a touch bus 20 connected to bus 16 via a resistor R6. Of course, instead of using a touch switch such as is constituted by touch contact TC and touch bus 20, a manually operated mechanical switch could be used. Closing of the touch switch will cause a small forward current to flow into the base of previously turned off transistor TR1, and the resultant emitter current of transistor TR1 will flow through resistor R4 increasing the voltage across resistor R4. This will have the effect of decreasing the base-emitter voltage of transistor TR1' and tend to turn this transistor off. The change will be amplified by transistors TR2' and TR3' decreasing the voltage across lamp L1' and hence the voltage fed back to the base of transistor TR1'. This will further decrease the base-emitter voltage of transistor TR1' causing this transistor and transistors TR2' and TR3' to turn off quickly.

The closing of the touch switch will turn on transistor TR1. Conduction of this transistor will turn on transistor TR2, and conduction of transistor TR2 will turn on transistor TR3, since each preceding transistor will cause base current to flow in each succeeding transistor.

When transistor TR3 turns on, lamp L1 will be illuminated, and the voltage developed across lamp L1 will be fed back to the base of transistor TR1 to keep this transistor turned on after touch switch TC is opened. Locking in of the stage is enhanced by capacit or C1, since it is essentially a short circuit when not charged, so that initially the full voltage across lamp L1 will be applied to the base of transistor TR1. A stable state will be achieved in which transistors TR2 and TR3 will be saturated and about +12 volts will be developed across lamp L1. The voltage across potentiometer P1 will be about +30 volts, and the voltage at the slider of potentiometer P1 will be that required for tuning of the varactor tuner to channel 2 and will be delivered to tuning bus 19 and thence to terminal E of the tuner.

It will be appreciated, of course, that isolating diode D20' will keep the tuning voltage on tuning bus 19 out of network 13.

The collector current of transistor TR1 and the base current of transistor TR2 are limited by resistor R4 and by the base voltage of transistor TR1 derived across lamp L1. The base current of transistor TR3 is limited by the voltage at the collector of transistor TR2 and by resistor R2.

A resistor could be used in place of lamp L1, but when a lamp is used, it can illuminate some indicator showing what channel has been selected and to which the tuner then is tuned.

For most reliable operation (positive turn on of transistor TR1) the voltage on bus 16 and the voltage applied to the base of transistor TR1 upon closure of the touch switch should be greater than the voltage on bus 17.

In the past, tuning of a varactor tuner has been accomplished by connecting the tuner to a potentiometer and varying the setting of the slider of the potentiometer or by using a number of preset potentiometers and mechanical switching. A channel selector system embodying one aspect of this invention employs preset potentiometers, but they do not have a voltage on them at all times and hence do not draw current at all times. In contrast, closing of a touch or other switch applies a voltage across the potentiometers.

Network 12 could be modified by eliminating transistor TR3, placing lamp L1 in parallel with potentiometer P1, connecting diode D2 to the collector of transistor TR2 and connecting the collector of transistor TR2 to resistor R3 for positive feedback. Such a network would require a more expensive lamp and more expensive regulation of the power supply connected to bus 16. For these reasons it has been found less expensive and just as effective to employ a third transistor.

It should be apparent from the foregoing that with a channel selecting system of the type shown in Fig. 1, channel selection is made by merely bridging one's finger across two touch contacts or by closing a switch, the network for the selected channel is electronically latched on, a visual indication of the selected channel is given and the network for the previously selected channel is cancelled.

Band switching is accomplished with the networks designated 21, 22 and 23. These networks are the same, so only network 21 will be described. It includes two transistors TR4 and TR5. The base of transistor TR4 is connected to bus 18 via a resistor R7. Similarly the bases of transistors TR4' and TR4'' are connected to buses 18' and 18'' respectively. Another resistor R8 bypassed by a filter capacitor C3 is connected between the base of transistor TR4 and ground. The emitter of transistor TR4 is connected to ground, while the collector is connected via a current limiting resistor R9 to the base of transistor TR5. A bus 24 connected to a DC power supply of, say, +12 volts is connected to the emitter of transistor TR5 and via a resistor R10 to its base. The collector of transistor TR5 is connected via an isolating diode D21 to terminal A and also is connected to terminal F. Similarly, the collector of transistor TR5' is connected via an isolating diode D22 to terminal A and and also is connected to terminal G, and the collector of transistor TR5'' is connected via a diode D23 to terminal K.

Transistors TR4 and TR5 normally are turned off. However, when any network 12 is energized, as will be the case when any channel from 2–6 is selected, as previously explained, a voltage of about +12 volts will be developed across one of the lamps L1 and will be supplied to bus 18 via the diode connected to that lamp. This positive voltage on bus 18 is of sufficient magnitude to forward bias the base-emitter junction of transistor TR4 and will turn on this transistor, which, in turn, will turn transistor TR5 on to saturation. Transistor TR5 then acts like a closed switch and applies the +12 volts of bus 24 to terminal A via diode D21 to energize the oscillator and RF stages of the VHF tuner 10 and applies a padding voltage to terminal F. On the other hand, when one of channels 7–13 is selected, transistors TR4' and TR5' will be turned on supplying volts to terminal A via diode D22 and a band-switching voltage to terminal G. When one of the UHF channels is selected, transistors TR4''and TR5'' will be turned on and +12 volts from bus 24 will be applied via diode D23 to the oscillator-mixer of UHF tuner 11.

Band switching (low VHF high VHF or UHF) also could be accomplished using networks 21, 22 and 23 each having only one transistor.

The AGC converter network 25 shown in Fig. 1 converts the high impedance source, negative-going, AGC voltage conventionally provided in a TV receiver to a low impedance source, negative-going voltage at a different level and with a smaller voltage swing. By use of the AGC converter network, it is possible to convert an AGC signal intended for control of a tube type tuner to an AGC signal suitable for use with a varactor tuner.

AGC converter network 25 includes two transistors TR6 and TR7 connected as a Darlington pair. The base electrode of transistor TR6 is connected to the slider of a potentiometer P2, and a filter capacitor C4 is connected between the base of transistor TR6 and ground. A Zener diode Z1 is connected in the emitter circuit of transistor TR7, the base emitter junction of a transistor serving as the Zener diode. A resistor R11 is connected between a bus 26 at, say, +12 volts and Zener diode Z1. A potentiometer P3 is connected between ground and the common terminal of Zener diode Z1 and resistor R11. The slider of potentiometer P3 is connected to terminals H and M. The collectors of transistors TR6 and TR7 are connected to a bus 27 at, say, −12 volts, this bus also being connected via a resistor R12 to the anode of diode D22 and terminal G, this latter connection being for the purpose of reverse biasing the bandswitching diodes to ensure low losses. It will be noted that bus 26 also is connected to terminals C and N. Potentiometer P2 is connected between the AGC signal input terminal 28 of the receiver and ground.

In place of Zener diode Z1, any other level shift device could be employed, i.e., any other device that would give a substantially constant voltage drop independent of the magnitude of the current flow therethrough.

Terminal 28 is connected to the AGC network of the TV or other receiver, e.g., FM receiver, and the AGC voltage at terminal 28 may vary from slightly positive to, say, 10 volts negative. The input impedance of network 25 is high because of the configuration in which transistors TR6 and TR7 are connected. The approximately 10 or 11 volt change across potentiometer P2 is reduced to the value required for the varactor tuner (about 7 volts change) by the setting of potentiometer P2. The AGC voltage at the slider of potentiometer P2 may vary from +0.5 volts to −6.5 volts. Since the Vbe of transistors TR6 and TR7 each is about 0.5 volts, while the Zener voltage of Zener diode Z1 may be, say, 6.8 volts, a voltage of +0.5 volts at the base of transistor TR6 becomes +8.3 volts at the anode of Zener diode Z1, while a negative voltage of 6.5 volts at the base of transistor TR6 becomes +1.3 volts at the anode of the Zener diode. The output impedance of network 25 is low and is essentially the value of resistor R11.

It will be seen from the foregoing that converter 25 converts an AGC signal that varies from slightly positive to −10 volts to a voltage across potentiometer P3 that changes from +8.3 to +1.3 volts and presents a low impedance output to terminals H and M. By selection of the Zener voltage and the position of the sliders of potentiometers P2 and P3, a wide range in conversion may be obtained.

The setting of the slider of potentiometer P3 determines the no signal voltage, i.e., if, say, Z volts is desired at the slider of potentiometer P3 for no AGC signal, the slider of potentiometer P3 is set to give this X volts with no signal input to terminal 28. The setting of the slider of potentiometer P2 varies sensitivity. Greater sensitivity is achieved as the percentage of the AGC voltage applied to the base of transistor TR6 increases.

While it is very desirable to employ two transistors TR6 and TR7 connected in emitter follower configuration as a high gain amplifier, i.e., as a Darlington pair, if a lower input impedance is tolerable, it would be possible to employ just one transistor TR6 connected in emitter follower configuration and with Zener diode Z1 in its emitter circuit. The use of a Darlington pair is desirable not only for the high impedance input that it gives, but also because the base emitter diodes of transistors TR6 and TR7 temperature compensate the junction of Zener diode Z1.

It is important to note that the stability of network 25 is high, since the base-emitter voltage drops of transistors TR6 and TR7 are almost constant with current.

Figures 2, 3, 4:
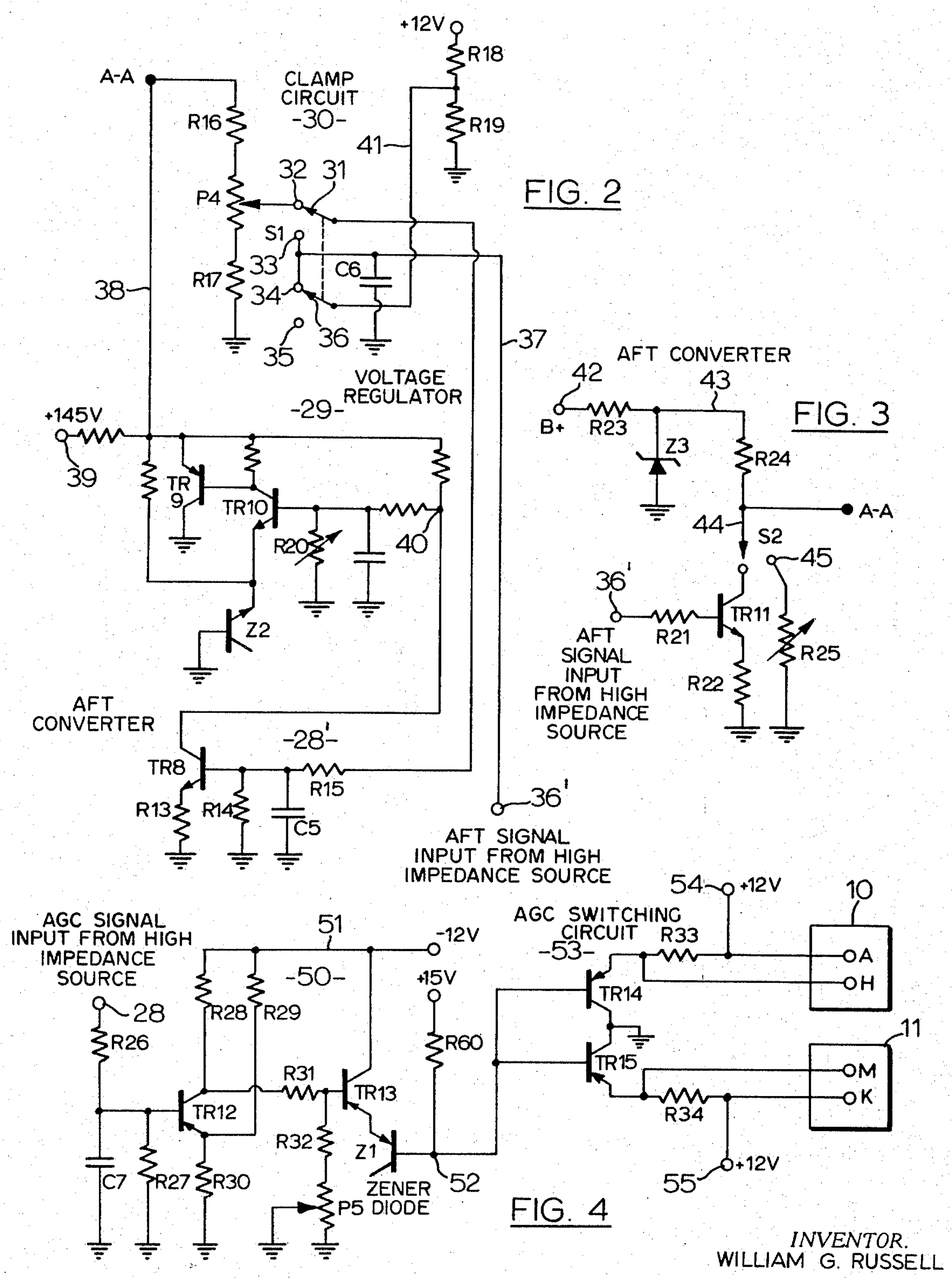
FIG. 2 is a circuit diagram showing the following aspects of this invention: an AFT conversion network and a clamp circuit for AFT control.
FIG. 3 is a circuit diagram of an alternative network to the network of FIG. 2.
FIG. 4 is a circuit diagram of an alternative AGC converter network and of an AGC switching circuit, each being a different aspect of this invention.

The network designated 28′ in Fig. 2 is AFT conversion network that, in conjunction with a voltage regulator 29, changes a high impedance source AFT voltage swing to a low impedance source voltage swing at a different level and in the same direction. The purpose is to change the AFT voltage conventionally derived from the AFT network of a TV receiver and which was intended to operate into a tube type tuner circuit to a voltage that is suitable for control of automatic fine tuning of a varactor type tuner.

Also shown in Fig. 2 is a clamp circuit 30 that will be discussed in detail hereinafter.

AFT converter 28′ includes a transistor TR8 whose emitter is connected to ground via a resistor R13. A resistor R14 and a filter capacitor C5 are connected in parallel with each other between the base of transistor TR8 and ground. A resistor R15 is connected in voltage divider configuration with resistor R14 and between the base electrode of transistor TR8 and one movable contact 31 of a switch S1.

Switch S1 has fixed contacts 32, 33, 34 and 35. Contacts 33 and 34 are connected together and via line 37 to the AFT signal input terminal 36′ of the TV receiver. A capacitor C6 is connected between ground and line 37. Contact 35 is open. Contact 32 is connected to the slider of a potentiometer P4. Potentiometer P4 is connected to bus 16 (Fig. 1) via a resistor R16 and to ground via a resistor R17. The other movable contact 36 of switch S1 is connected to the common terminal of two resistors R18 and R19 connected in series with each other between ground and a DC power supply at, say, +12 volts. Movable contacts 31 and 36 are ganged together. Voltage regulator 29 is of a conventional shunt type and regulates the voltage on line 38 connected to bus 16. The nominal voltage on line 38 may be +30 volts, and the $B^+$ voltage applied to terminal 39 may be +145 volts. The voltage regulator includes two transistors TR9 and TR10, a Zener diode Z2 and a variable resistor R20. It differs from a conventional voltage regulator system in that it has an input terminal 40 connected to the collector of transistor TR8.

The operation of the circuitry shown in Fig. 2 now will be discussed assuming that +6 volts at terminal 36′ indicates correct tuning, it being understood that terminal 36′ is connected to the AFT network of the TV or other receiver and receives a signal that varies both above and below +6 volts depending upon the direction and magnitude of mistuning. Converter 28' has a high impedance input and a low impedance output and applies its output signal to terminal 40.

Regulator 29 normally regulates bus 16 at, say, +30 volts, but with AFT on and operating (contact 31 engaging contact 33), any change from +6 volts in the AFT signal applied across resistors R15 and R14 will change the voltage at input terminal 40 and hence the voltage to which regulator 29 will regulate. Thus an increase in the AFT signal to, say, +7 volts will result in a decrease in the voltage applied to terminal 40 and an increase in the voltage applied to bus 16, and as long as the AFT signal remains at +7 volts, the voltage on bus 16 will be regulated at its larger value.

It will be seen from the foregoing that the AFT signal is used to vary the reference voltage to which the voltage regulator regulates, and, with the circuitry shown in Fig. 2, high impedance to low impedance conversion is achieved as well as a change in the tuning voltage on bus 16.

Manual fine tuning is accomplished with the movable contacts of switch S1 in the position shown in Fig. 2 wherein the voltage at the slider of potentiometer P4 is applied across resistors R14 and R15 and the voltage on bus 16 is varied by changing the setting of the slider of potentiometer P4.

Figure 6:
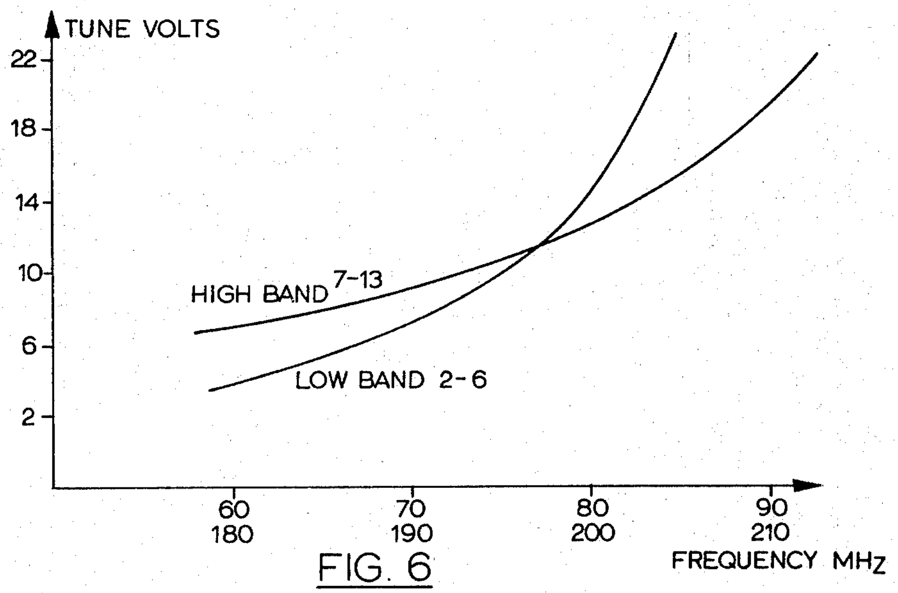
FIG. 6 is a graph showing tune volts plotted against frequency useful in understanding the reason for the circuitry of Fig. 5.

The manual control of fine tuning in the situation where tuning is varied by applying a variable voltage to a voltage variable capacitance diode will have varying sensitivities over the range of channels 2 to 6 and 7 and 13, as is shown in Fig. 6. When the fine tuning range is sufficient on channel 6, it will be found that a much larger than required range results for the lower frequency channel 2, and, because of this, when the AFT switch is operated, the receiver may lock on a spurious carrier or on the sound or picture carrier of the next adjacent channel. In other words, it is possible for the receiver to become so mistuned manually that when the AFT system is operated, either the AFT system will be incapable of correcting the degree of previous mistuning or will exert a corrective effect but to the wrong point. Clamping network 30 is an important feature of this aspect of the invention and is provided to ensure that tuning to the proper channel always will be effected when the AFT system is rendered effective. Thus, when switch S1 is in the manual fine tuning position, AFT line 37 is connected via contacts 34 and 36 and line 41 to the common terminal of resistors R18 and R19. These resistors are so proportioned as to apply a voltage to line 37 that preferably is the same, i.e., +6 volts, as would be applied to line 37 with a properly tuned receiver. This voltage is maintained by capacitor C6 for a time longer than the switching time, so that when switch S1 is moved to the AFT position with movable contact 31 engaging fixed contact 33, the voltage across capacitor C6 will force the tuning of the receiver to be near correct tuning before capacitor C6 has time to discharge and until the AFT signal on line 37 takes over, at which point the voltage across capacitor C6 will follow the AFT voltage.

It will be appreciated, of course, that the voltage applied to line 37 with switch S1 in the manual fine tuning position need not be a center voltage, i.e., the voltage that would be on line 37 with AFT on and a properly tuned receiver, but should be of such a value as to ensure that the tuner always will lock on the proper channel when the AFT system is operated and will be within the pull-in range of the AFT system.

The +6 volts derive across resistor R19 comes from a low impedance source, and, this being the case, will hold the voltage across capacitor C6 at about +6 volts and will override variations that may occur in the AFT voltage on line 37.

In place of AFT converter 28' and regulator 29, the network shown in Fig. 3 may be employed. This network is a conversion circuit that changes a high impedance source voltage swing to a low impedance source voltage change at a different level with the latter change being opposite in direction to the former. The network includes a transistor TR11 whose base is connected via a resistor R21 to AFT signal input terminal 36'. A resistor R22 is connected between the emitter of transistor TR11 and ground. A suitable DC supply voltage is applied to a terminal 42 connected via a resistor R23 to a Zener diode Z3 that keeps the voltage on line 43 at, say, +34 volts, the Zener diode being connected between line 43 and ground. Connected between line 43 and the collector of transistor TR11 via a switch S2 is a resistor R24. The movable contact 44 of switch S2 is connected to bus 16 (Fig. 1). Connected between one of the fixed contacts 45 of switch S2 and ground is a variable resistor R25.

The AFT signal from the TV receiver is applied to terminal 36' and has a value of, say, +6 volts when the receiver is properly tuned. The current drawn through resistors R24 and R22 under these circumstances with switch S2 in the AFT position, i.e., the position shown in Fig. 3, is such that the voltage at the collector of transistor TR11 and hence on bus 16 will be, say, +30 volts. When the AFT voltage changes, because the same current flows through resistors R22 and R24, the voltage at the collector of transistor TR11 will change in proportion to the ratio of the values of resistors R24 and R22. The voltage charge at the collector of transistor TR11 is opposite in direction to the voltage change at the base of transistor TR11, and, as explained above, while at a higher level, is a smaller voltage change than that at the base of transistor TR11. With resistor R24 at half the value of resistor R22, the output voltage swing will be one-half the input voltage swing.

Manual fine tuning is effected with the network of Fig. 3 by moving contact 44 into engagement with contact 45 and varying resistor R25.

The disadvantage of the network of Fig. 3 over that of the network of Fig. 2 is the relatively poor voltage regulation that results from resistor R24 being in series with bus 16, since any changes in the load on bus 16 will vary the current supplied to the bus and necessarily will cause an IR drop in resistor R24 which will vary the voltage on bus 16. However, the network of Fig. 3 has a relatively low output impedance, that being essentially the impedance of resistor R24.

It will be appreciated that with the network of Fig. 2, the voltage on line 16 will increase and decrease as the AFT voltage increases and decreases respectively above and below, say, +6 volts, whereas with the network of Fig. 3, the voltage on line 16 will increase and decrease as the AFT voltage decreases and increases respectively below and above +6 volts. Obviously both networks could not be used with the same varactor tuner, but all that is required to overcome this problem is the use of appropriate discriminators delivering signals to the two networks such that when the frequency increases or decreases, the voltage changes on lines 16 are in the same direction.

An alternate AGC converter circuit to that shown at 25 in Fig. 1 is shown at 50 in Fig. 4. The AGC converter circuit shown in Fig. 4 converts an AGC voltage intended for a tube type tuner to a delayed AGC voltage of the correct direction and level to operate a varactor tuner.

As far as delay is concerned, it is known to apply the AGC signal immediately to the IF amplifier of the receiver and to delay application of the AGC signal to the tuner to preserve a good signal to noise ratio of the tuner for weak signals. One technique for accomplishing this result is embodied in network 50.

Referring to Fig. 4, network 50 includes two transistors TR12 and TR13. Resistors R26 and R27, the latter having a filter capacitor C7 connected across it, are connected in voltage divider relationship between AGC signal input terminal 28 and ground, and the common terminal of resistors R26 and R27 is connected to the base of transistor TR12. The collector of transistor TR12 is connected via a resistor R28 to a bus 51 at a negative DC potential of, say, +12 volts. Connected in voltage divider relationship between bus 51 and ground is an AGC delay resistor R29 and an unbypassed emitter resistor R30, the common terminal of these two resistors being connected to the emitter of transistor TR12.

Connected in voltage divider relationship between bus 51 and ground are resistor R28, a resistor R31 that also is connected between the collector of transistor TR12 and the base of transistor TR13, a resistor R32 and a potentiometer P5. The common terminal of resistors R31 and R32 is connected to the base electrode of transistor TR13. The collector of transistor TR13 is connected to bus 51, while a Zener diode Z1 corresponding to Zener diode Z1 of Fig. 1 is connected between the emitter of transistor TR13 and the output terminal 52 of AGC converter 50. As in AGC converter 25 of Fig. 1, the base-emitter junction of a transistor is used as a Zener diode.

A suitable positive DC potential, say, +15 volts is supplied to one terminal of a resistor R60. The other terminal of resistor R60 is connected to terminal 52.

A high source impedance AGC signal that may vary from, say, 0 to −13 volts is applied to AGC signal input terminal 28. The voltage divider action of resistors R26 and R27 reduces this swing to from, say, 0 to −6 volts.

The emitter of transistor TR12 is set at a negative voltage of, say, −2.5 volts determined by the values of resistors R29 and R30 and the magnitude of the negative voltage applied to bus 51. The result of this negative bias applied to the emitter of transistor TR12 is that transistor TR12 is kept off until the AGC signal at the base of transistor TR12 goes sufficiently negative (about −3 volts) to overcome the reverse bias and the base-emitter drop of the transistor. In this manner delayed AGC is achieved.

Once transistor TR12 has been turned on, the conduction of transistor TR13 will decrease and the voltage at its base electrode will change from a negative voltage determined by the voltage on bus 51, the values of resistors R28, R31 and R32 and the setting of potentiometer P5 to a lower negative voltage determined by voltage on bus 51, the degree of conduction of transistor TR12, the values of resistors R31 and R32 and the setting of potentiometer P5. For an AGC signal that provides −3 volts at the base of transistor TR12, the base voltage of transistor TR13 may be −6 volts. The emitter voltage of transistor TR13 then will be about −5.5 volts and, if Z1 is a 7.1 volt Zener, the AGC voltage at terminal 52 will be 7.1−5.5=+1.6 volts. When the AGC signal at the base of transistor TR12 has decreased to, say, −6 volts, the voltage at the base of transistor TR13 will be about −4 volts and the voltage at the emitter of transistor TR13 then will be about −3.5 volts, resulting in an AGC voltage at terminal 52 of about +3.6 volts.

By use of the circuit of Fig. 4 not only is it possible to convert an AGC signal intended for control of a tube type tuner to an AGC signal suitable for use with a varactor tuner, but the required delay in tuner AGC to preserve a good signal to noise ratio of the tuner is obtained. By proper selection of the components of the circuit of Fig. 4, it can be assured that when the signal level at the antenna input is about 1,000 microvolts, the AGC will start and then will move quickly to aid in maintaining the video output level constant.

It should be noted that by adjusting the setting of potentiometer P5, it is possible to adjust the AGC voltage at terminal 52.

Also shown in Fig. 4 is an AGC switching circuit 53. In this respect it has been found desirable to remove the DC AGC voltage from the RF amplifier of the tuner 10 or 11 that is supposed to be in the off state to prevent possible damage from high current and voltage breakdown as well as the passing of unwanted signals through the "off" tuner. Test have shown that the RF stage of some tuner circuits are partially turned on when an RF stage base-emitter current is caused to flow by an AGC signal even without the normal supply voltage connection to the RF stage.

The power required for normal AGC is very small when the RF stage to which the AGC signal is applied is connected to a power supply but large when the supply is disconnected with AGC left on. In the latter case the RF stage transistor will conduct like a diode, and current drawn from the AGC source will be limited by only the emitter resistance of the stage and may go as high as 10 ma. Since normal AGC current is less than 0.1 ma, a much lower impedance source would be required to supply power enough for the disconnected tuner while the other tuner is being used.

AGC switching circuit 53 employs two transistors TR14 and TR15 having a common input and separate outputs. As shown in the Figure, the bases of transistors TR14 and TR15 are connected to AGC output terminal 52, while the collectors of the transistors are grounded. A positive DC voltage, say, +12 volts is applied to terminal 54 via suitable bandswitching circuitry (TR5 or TR5′ via D21 or D22–see Fig. 1), while, say, +12 volts is applied to terminal 55 via suitable bandswitching circuitry (TR5″ and D23–see Fig. 1).

Terminal 54 is connected to terminal A (oscillator $B^+$) of VHF tuner 10 and via resistor R33 to the emitter of transistor TR14. The emitter of transistor TR14 also is connected to terminal H (AGC input) of VHF tuner 10, the terminals (other than A and H) of VHF tuner 10 shown in Fig. 1 having been omitted from Fig. 4 to simplify the drawing.

Terminal 55 is connected to terminal K (oscillator-mixer $B^+$) of UHF tuner 11 and via resistor R34 to the emitter of transistor TR15. The emitter of transistor TR15 also is connected to terminal M (AGC input) of UHF tuner 11, the terminals (other than M and K) of UHF tuner 11 shown in Fig. 1 having been omitted from Fig. 4 to simplify the drawing.

When a VHF channel is selected, B+ is applied to terminal A of VHF tuner 10 and via resistor R33 to the emitter of transistor TR14. Transistor TR14 will turn on under these circumstances permitting any AGC signal to be supplied from terminal 52 to terminal H, the emitter voltage of transistor TR14 following its base voltage with the normal 0.5 volt offset. When transistor TR14 is turned on, however, B+ will not be applied to terminal 55, transistor TR15 will be turned off and no AGC signal will be permitted to pass to terminal M via transistor TR15. When a UHF channel is selected, the situation reverses, transistor TR15 is turned on, transistor TR14 will be turned off, $B^+$ will be applied to terminal K and AGC will be applied to terminal M but not to terminal H.

Figure 7:
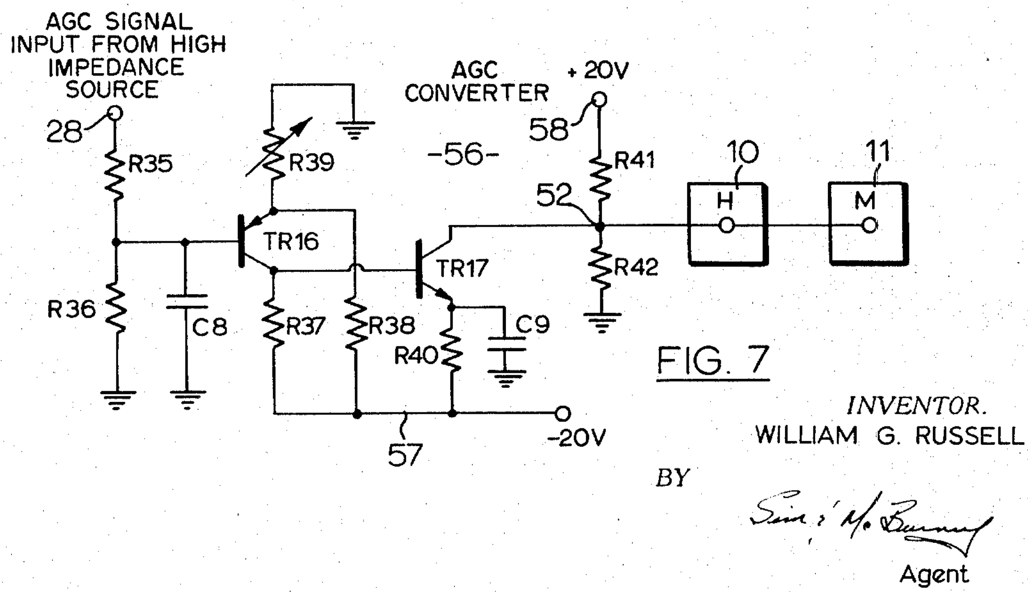
FIG. 7 is a circuit diagram of yet another alternative AGC converter network.

Another alternate AGC converter circuit to that shown at 25 in Fig. 1 is shown at 56 in Fig. 7. Like the AGC converter of Fig. 4, the AGC converter of Fig. 7 converts a high impedance source AGC voltage to a delayed, low impedance source AGC voltage of the correct direction and level to operate a varactor tuner. The converter circuit of Fig. 7 also is designed so that an abnormal swing in the AGC input signal is limited as far as the AGC output signal of the network is concerned.

Referring to Fig. 7, converter 56 includes two transistors TR16 and TR17. Resistors R35 and R36, the latter having a filter capacitor C8 connected across it, are connected in voltage divider relationship between AGC signal input terminal 28 and ground, and the common terminal of resistors R35 and R36 is connected to the base electrode of transistor TR16. The collector of transistor TR16 is connected via a resistor R37 to a bus 57 at a negative DC potential of, say, −20 volts. Connected in voltage divider relationship between bus 57 and ground is a resistor R38 and an unbypassed variable emitter resistor R39, the common terminal of these two resistors being connected to the emitter of transistor TR16.

The collector of transistor TR16 is connected to the base of transistor TR17. The emitter of transistor TR17 is connected via a resistor R40 to bus 57. A filter capacitor C9 is connected between the emitter of transistor TR17 and ground.

Connected in voltage divider relationship between a terminal 58 at a positive DC potential of, say, +20 volts and ground are resistors R41 and R42, the common terminal of these resistors being connected to the collector of transistor TR17.

A high source impedance AGC input signal that may vary between, say, 0 and −18 volts is applied to terminal 28. The voltage divider action of resistors R35 and R36 reduces this swing to an appropriate level.

The emitter of transistor TR16 is set at a negative voltage of, say, −6 volts determined by resistors R38 and R39 and the potential of bus 57. The negative biasing of the base-emitter junction provides the desired delay in AGC.

When the AGC signal applied to terminal 28 has become sufficiently negative that the voltage at the base of transistor TR16 is able to overcome the aforesaid reverse bias and the base-emitter drop of the transistor, this being achieved with a base voltage of about −6.5 volts in the present case, transistor TR16 will turn on, collector current will flow and transistor TR17 will turn on, whereas, when the AGC signal at the base of transistor TR16 was more positive than −6.5 volts, transistor TR16 was turned off, both the base and emitter of transistor TR17 were at −20 volts, transistor TR17 consequently was turned off, and terminal 52 was at a positive DC potential of, say, +8 volts determined by resistors R41 and R42 and the DC potential of terminal 58.

Once transistor TR17 has commenced conduction, collector current conducted through resistor R41 quickly will reduce the output voltage at terminal 52 due to the current gain of transistors TR16 and TR17 causing the emitter of transistor TR17 to go to about −15 volts and producing a voltage at terminal 52 of about −5 volts for a −18 volt AGC signal applied to terminal 28. If the signal applied to terminal 28 should change to, say, −19 volts causing the signal applied to the base of transistor TR16 to change to, say, −14 volts, the emitter of transistor TR16 will be at about −13.5 volts and the collector of transistor TR16 will be at about −14.5 volts (0.5 volts less than the emitter of transistor TR17), leaving only about 1 volt collector to emitter of transistor TR16. Consequently, any further change in a more negative direction of the AGC input signal will not cause any further change in the AGC output signal at terminal 52 because of the lack of sufficient emitter to collector voltage for transistor TR16.

Terminal 52 of network 56 is connected to terminals H AND M of tuners 10 and 11. This connection is shown as a simple direction connection IN Fig. 7 with all other terminals except H and M of the tuners not shown in the Figure for sake of simplicity, but is is to be understood that the connection may be made as shown in Fig. 1 or shown in Fig. 4 and, of course, it is to be understood that network 53 of Fig. 4 may be used in conjunction with network 25 of Fig. 1.

Figure 5:
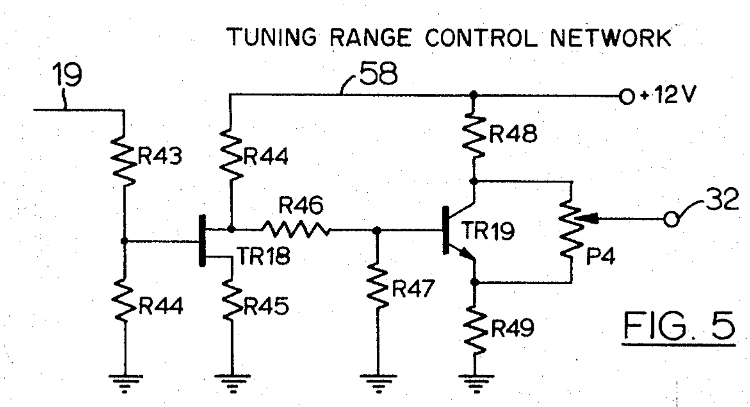
FIG. 5 is a circuit diagram of a tuning range control network according to an aspect of this invention.

Referring now to Fig. 5, there is shown a fine tuning range control that varies the DC voltage across fine tune potentiometer P4 (while holding the "center" voltage constant) in proportion to the magnitude of the DC tune voltage on tuning bus 19.

As in shown in Fig. 6, over the whole of both the high and low VHF bands there is a large variation in frequency versus equal increments of tune voltage, so that the frequency range of fine tuning with a fixed voltage difference across the fine tune potentiometer varies widely, being large for low frequency channels (high sensitivity) in both bands and small for high frequency channels (low sensitivity) in both bands. This change in sensitivity would be even more pronounced if the tune voltage were applied directly to the tuner diodes. The preset potentiometers P1, P1', etc., provide some correction because of their voltage dividing action.

The network of Fig. 5 operates to provide a voltage difference across potentiometer P4 that is proportional to the tune voltage of tuning bus 19 so that a more constant frequency change (constant sensitivity) may be obtained on all channels. It is to be understood that potentiometer P4 of Fig. 5 replaces potentiometer P4 of Fig. 2, resistors R16 and R17 and their connections to bus 16 and ground respectively being eliminated, and terminal 32 in Fig. 5 corresponding to terminal 32 in Fig. 2.

As shown in Fig. 5, the tune voltage, say, +2 to +30 volts, on tuning bus 19 is divided down by the voltage divider consisting of resistors R43 and R44 connected between bus 19 and ground and the common terminal of which is connected to the gate of an "N" channel FET TR18. The divided down tuning voltage is applied to the gate of FET TR18. A resistor R44 is connected between the drain of FET TR18 and a bus 58 at a positive DC potential, say, +12 volts. The source of FET TR18 is connected via a resistor R45 to ground.

The voltage division by resistors R43 and R44 provides a variation at the gate of FET TR18 of from, say, 0.2 to 3 volts for a tuning voltage variation of from 2 to 30 volts. This will cause a drain voltage variation of from, say, 8 to 10 volts that is divided down to the base of transistor TR19 by resistors R46 and R47 resulting in a change at the base of transistor TR19 of from, say, 3.9 to 5.3 volts. As may be seen from FIG. 5, resistors R46 and R47 are connected in voltage divider relationship between the drain of FET TR18 and ground, the common terminal of the resistors being connected to the base of transistor TR19.

The collector and emitter resistors R48 and R49 of transistor TR19 are of the same value and are connected respectively between bus 58 and the collector of transistor TR19 and between the emitter of transistor TR19 and ground. Potentiometer P4 is connected between the collector and emitter electrodes of transistor TR19, and the slider of the potentiometer is connected to terminal 32.

In operation, with a supply voltage of +12 volts and resistors R48 and R49 equal to each other, the midpoint of linear potentiometer P4 will be at one-half the supply voltage, namely +6 volts, and will remain at this value for any change within the operating range at the gate of FET TR18 because consequent voltage changes at the collector and emitter of transistor TR19 will be of the same magnitude but in opposite directions. In this manner it is possible to provide a constant voltage at the midpoint of potentiometer P4 that indicates correct tuning, i.e., the AFT signal when the receiver is perfectly tuned.

When the tuning voltage is low, say, 0.2 volts at the gate of FET TR18, the voltage at the base of transistor TR19 may be, say, 5.3 volts, and the voltage at the collector and emitter of transistor TR19 may be, say, 7.2 and 4.8 volts respectively, resulting in a voltage across potentiometer P4 of 2.4 volts. On the other hand, with 3 volts applied to the gate of FET TR18, the voltage across potentiometer P4 will be greater, say, 5.2 volts, so that regardless of the channel selected, the same degree of movement of the slider of potentiometer P4 will give about the same change in frequency, whereby substantially constant sensitivity is obtained.

In the network of Fig. 5 FET TR18 and resistors R46 and R47 ensure that there is provided at the base of transistor TR19 a voltage that is at the correct level and a voltage swing of appropriate magnitude, but it may be possible in some cases to eliminate these components and apply the tuning voltage directly to the base of transistor TR19 via a voltage divider.

What I claim as my invention is:

1. In combination with a signal receiver of a type including AGC network means providing an AGC signal and a tuner of a type employing the voltage variable capacitance characteristic of a voltage variable capacitance diode for varying the tuning of said receiver and having an AGC signal input terminal; an AGC converter network for converting the AGC output signal of said AGC network means to a level and source impedance suitable for use with said tuner, said AGC converter network including first and second transistors having base, collector and emitter electrodes, means supplying said AGC output signal to said base electrode of said first transistor, first and second terminals at different DC potentials, means connecting said first terminal and said collector electrode of said first transistor, means connecting said first terminal and said emitter electrode of said second transistor, means connecting said second terminal and said collector electrode of said second transistor, means connecting said first and second transistors to turn on said second transistor in response to conduction of said first transistor, means connecting said collector electrode of said second transistor and said AGC signal input terminal, and means for applying a reverse bias between said base and emitter electrodes of said first transistor to provide a delayed AGC signal from said AGC converter network.

2. The invention according to claim 1 wherein said means supplying said AGC output signal to said base electrode of said first transistor includes voltage divider means.

3. The invention according to claim 1 wherein said means applying a reverse bias include a first resistor connected between said first terminal and said emitter electrode of said first transistor and a second resistor connected in voltage divider relationship with said first resistor between said emitter electrode of said first transistor and a third terminal at a DC potential intermediate the DC potentials of said first and second terminals.

4. The invention according to claim 3 wherein the DC potentials of said first and second terminals are of opposite polarity.

5. The invention according to claim 3 wherein said second resistor is a variable resistor.

6. The invention according to claim 5 wherein the DC potentials of said first and second terminals are of opposite polarity.

7. The invention according to claim 6 wherein said transistors are of opposite conductivity types.

8. The invention according to claim 7 wherein said collector electrode of said first transistor is connected to said base electrode of said second transistor.

* * * * *